(12) United States Patent
Hirano

(10) Patent No.: US 8,042,080 B2
(45) Date of Patent: Oct. 18, 2011

(54) ELECTRO-MIGRATION VERIFYING APPARATUS, ELECTRO-MIGRATION VERIFYING METHOD, DATA STRUCTURE AND NETLIST USED IN THE SAME

(75) Inventor: Shozo Hirano, Hyogo (JP)

(73) Assignee: Panasonic Corporation, Osaka (JP)

( * ) Notice: Subject to any disclaimer, the term of this patent is extended or adjusted under 35 U.S.C. 154(b) by 209 days.

(21) Appl. No.: 11/882,344

(22) Filed: Aug. 1, 2007

(65) Prior Publication Data
US 2008/0034336 A1 Feb. 7, 2008

(30) Foreign Application Priority Data

Aug. 1, 2006 (JP) ................. P.2006-209822

(51) Int. Cl.
*G06F 17/50* (2006.01)
*G06F 9/455* (2006.01)
(52) U.S. Cl. ............ 716/112; 716/106; 716/111
(58) Field of Classification Search .......... 716/2, 4, 716/5, 8
See application file for complete search history.

(56) References Cited

U.S. PATENT DOCUMENTS

| | | | | |
|---|---|---|---|---|
| 5,878,053 | A * | 3/1999 | Koh et al. ............... | 714/724 |
| 6,072,945 | A | 6/2000 | Aji et al. | |
| 6,308,310 | B1 | 10/2001 | Nakamura | |
| 6,675,139 | B1 * | 1/2004 | Jetton et al. ............. | 703/17 |
| 7,210,109 | B2 * | 4/2007 | Caron et al. ............. | 716/4 |
| 7,240,314 | B1 * | 7/2007 | Leung ...................... | 716/8 |
| 7,404,161 | B2 * | 7/2008 | Dutt et al. ................ | 716/5 |
| 7,503,021 | B2 * | 3/2009 | Boucher et al. ......... | 716/4 |
| 2003/0014201 | A1 * | 1/2003 | Schultz .................... | 702/64 |

(Continued)

FOREIGN PATENT DOCUMENTS

JP   11-175576   7/1999

(Continued)

OTHER PUBLICATIONS

"HSIM^plus Post-layout Analysis," Synoposys Predictable Success, retrieved on May 31, 2007, Synopsys Inc., 2007.

(Continued)

*Primary Examiner* — Jack Chiang
*Assistant Examiner* — Patrick Sandoval
(74) *Attorney, Agent, or Firm* — McDermott Will & Emery LLP

(57) ABSTRACT

An electro-migration verifying method is comprised of: a data inputting process step; a netlist updating process step (first process operation) for updating a netlist which is constructed by a wiring line parasitic element and a device element based upon a current density limit value database, a characteristic variation database, and wiring line current information; a current density calculating process step (second process operation) for calculating current density of the wiring line parasitic element from a device current and the updated netlist; a wiring line current information updating process step (third process operation) for updating the wiring line current information based upon the current density; a current density limit value comparing/judging process step (fourth process operation) for judging whether or not a current density value is located within the current density limit value based upon the updated wiring line current information and the current density limit value database; an electro-migration verifying process step constituted by the first process operation up to a fifth process operation of a step judging process step (fifth process operation) for judging a repetition process operation from step information; and a result outputting process step.

11 Claims, 19 Drawing Sheets

U.S. PATENT DOCUMENTS

| | | | |
|---|---|---|---|
| 2005/0289486 A1* | 12/2005 | Caron et al. | 716/3 |
| 2006/0015836 A1* | 1/2006 | Curtin et al. | 716/10 |
| 2006/0080630 A1* | 4/2006 | Lin | 716/11 |
| 2007/0299647 A1* | 12/2007 | Bolcato et al. | 703/14 |
| 2009/0024969 A1* | 1/2009 | Chandra | 716/5 |

FOREIGN PATENT DOCUMENTS

| | | |
|---|---|---|
| JP | 2001-352059 | 12/2001 |
| JP | 2002-009159 | 1/2002 |
| JP | 2002-175345 | 6/2002 |
| JP | 2003-188184 | 7/2003 |
| JP | 2005-251057 | 9/2005 |

OTHER PUBLICATIONS

"Astro-Rail, A Comprehensive Power-Integrity Analysis, Implementation and Verification Tool," Synopsys Data Sheet, 2003.

* cited by examiner

```
Xm1 n1:m1:s n2:m1:g n3:m1:d n1:m1:b m1 ¥
l=0.25 w=2 fc=xx fd=xx ··
    :
r1 n1:m1:s n1:1 5ohm ra ly=co a=0.2 fb=4 ··
r11 n1:1 n1:2 1.5ohm rb ly=m1 l=2 w=4 fa=0 ··
    :
r7 n1:2 n1:7 1.5ohm rb ly=m1 l=2 w=4 fa=1 ··
    :
```

FIG. 6

$$iavg = [1/T \int_0^T f(t)dt] \quad \sim 0601$$

$$imax = MAX(|f(t)|) \quad \sim 0602$$

$$irms = [1/T \int_0^T f^2(t)dt]^{\frac{1}{2}} \quad \sim 0603$$

WIRING LINE
$$cdavg = iavg/w \quad \sim 0604$$

CONTACT/VIA
$$cdavg = iavg/a \quad \sim 0605$$

WIRING LINE
$$cdmax = imax/w \quad \sim 0606$$

CONTACT/VIA
$$cdmax = imax/a \quad \sim 0607$$

```
# name cdavg cdmax cdrms
# T = 1
r1 20 20 20
r2 0 0 0
r3 8 8 8
r4 0 0 0
r5 21 21 21
r6 9 9 9
r7 13 13 13
r8 4 4 4
r9 19 19 19
r10 12 12 12
r11 6 6 6
r12 4 4 4
r13 18 18 18
r14 2 2 2
r15 11 11 11
r16 10 10 10
r17 2 2 2
r18 18 18 18
r19 15 15 15
```

```
# name cdavg cdmax cdrms
# T = 2
r1 20 20 20
r2 0 0 0
r3 9 10 9
r4 8 8 8
r5 17 21 17
r6 13 17 13
r7 13 13 13
r8 7 10 7
r9 15 19 15
r10 14 16 14
r11 5 6 5
r12 6 8 6
r13 10 18 10
r14 1 2 1
r15 12 13 12
r16 10 10 10
r17 4 6 6
r18 13 18 13
r19 12 15 12
```

FIG. 9

```
# T_UNIT=1M
If(temp=125)
    If(ly=m1)
        cdavg_th = 1400
        cdmax_th = 350
    endif
endif
```
~0901

```
# T_UNIT=1M
If(temp=125)
  If(ly=m1)
    if(fa >= 1)
        cdavg_th = 900
        cdmax_th = 300
    else
        cdavg_th = 1400
        cdmax_th = 350
    endif
endif
```
~0902

```
# name cdavg cdmax cdrms
# T = 50
      :
r7 18 42 21
      :
```

CURRENT DENSITY LIMIT VALUE COMPARING/JUDGING PROCESS (T = 50)

1101 WIRING LINE CURRENT INFORMATION — cdavg cdmax T

1102 CURRENT DENSITY LIMIT VALUE DATABASE — cdavg_th cdmax_th

1103 CURRENT DENSITY LIMIT VALUE COMPARING/JUDGING PROCESS cdavg * T >= cdavg_th
18 * 50 >= 900 cdavg >= cdavg_th
42 < 300

1104 JUDGEMENT RESULT r7 error in T = 50

(T = 50)  ~ 1201

Xm1 n1:m1:s n2:m1:g n3:m1:d n1:m1:b m1 ¥
l=0.25 w=2 ·· fa=xx fb=xx ··
 :
r1 n1:m1:s n1:1 5.5 ra ly=co a=0.2 fb=4 ··
r11 n1:1 n1:2 1.8 rb ly=m1 l=2 w=4 fa=0 ··
 :
r7 n1:2 n1:7 1.7 rb ly=m1 l=2 w=4 fa=1 ··
 :

NET LIST UPDATING PROCESS (T = 51)  ~ 1202

Xm1 n1:m1:s n2:m1:g n3:m1:d n1:m1:b m1 ¥
l=0.25 w=2 ·· fa=xx fb=xx ··
 :
r1 n1:m1:s n1:1 5.5 ra ly=co a=0.2 fb=4 ··
r11 n1:1 n1:2 1.8 rb ly=m1 l=2 w=4 fa=0 ··
 :
~~r7 n1:2 n1:7 1.7 rb ly=m1 l=2 w=4 fa=1 ··~~
 :

(T = 50)  ~ 1301

Xm1 n1:m1:s n2:m1:g n3:m1:d n1:m1:b m1 ¥
  l=0.25 w=2 · · fa=xx fb=xx · ·
  :
r1 n1:m1:s n1:1 5.5 ra ly=co a=0.2 fb=4 · ·
r11 n1:1 n1:2 1.8 rb ly=m1 l=2 w=4 fa=0 · ·
  :
r7 n1:2 n1:7 1.7 rb ly=m1 l=2 w=4 fa=1 · ·
  :

NET LIST UPDATING PROCESS (T = 51)  ~ 1302

Xm1 n1:m1:s n2:m1:g n3:m1:d n1:m1:b m1 ¥
  l=0.25 w=2 · · fa=xx fb=xx · ·
  :
r1 n1:m1:s n1:1 5.5 ra ly=co a=0.2 fb=4 · ·
r11 n1:1 n1:2 1.8 rb ly=m1 l=2 w=4 fa=0 · ·
  :
r7 n1:2 n1:7 1G rb ly=m1 l=2 w=4 fa=1 · ·
  :

WEEK

IN AN EXAMPLE, WHILE A 10 nsec AVERAGED CURRENT OF THE CIRCUIT SIMULATION IS USED AS A CURRENT FOR 1 TIME STEP (1 month) OF ELECTRO-MIGRATION VERIFICATION, AN AGING EFFECT FOR 120 TIME STEPS (10 years) IS VERIFIED PRECEDING CIRCUIT SIMULATION (m1 Ids) ~ 1601

CURRENT VALUE

——— AVERAGE 2 mA

WEEK

5usec    10usec

1602

M1 MODEL = 2 mA

CURRENT MODE ~ 1603

```
subckt m1 d g s b
Ids s d 2mA
.ends
```

NET LIST ~ 1604

```
Xm1 n1:m1:s n1:m1:g n1:m1:d n1:m1:b m1
  :
r1  n1:m1:s n1:1 5 ra ly=co a=0.2 fb=4  ··
r11 n1:1 n1:2 1.5 rb ly=m1 l=2 w=4 fa=0  ··
  :
r7  n1:2 n1:7 1.5 rb ly=m1 l=2 w=4 fa=1  ··
  :
```

| ELEMENT NAME | fa |
|---|---|
| R100 | 1 |
| R101 | 0 |
| R102 | 1 |
| R103 | 1 |

| ELEMENT NAME | fb |
|---|---|
| R200 | 4 |
| R201 | 4 |
| R202 | 4 |
| R203 | 4 |

FIG. 19

STEP INFORMATION ~ 1901

T = 0
T_UNIT = 1M
T_START = 1
T_END = 120
T_STEP = 1

STEP INFORMATION ~ 1902

T = 1
T_UNIT = 1M
T_START = 1
T_END = 120
T_STEP = 1

STEP INFORMATION ~ 1903

T = 2
T_UNIT = 1M
T_START = 1
T_END = 120
T_STEP = 1

(T = 1)  ~ 2001

Xm1 n1:m1:s n2:m1:g n3:m1:d n1:m1:b m1 ¥
l=0.25 w=2 ·· fa=xx fb=xx ··
  :
r1 n1:m1:s n1:1 5 ra ly=co a=0.2 fb=4 ··
r11 n1:1 n1:2 1.5 rb ly=m1 l=2 w=4 fa=0 ··
  :
r7 n1:2 n1:7 1.5 rb ly=m1 l=2 w=4 fa=1 ··
  :

NET LIST UPDATING PROCESS (T = 2)  ~ 2002

Xm1 n1:m1:s n2:m1:g n3:m1:d n1:m1:b m1 ¥
l=0.25 w=2 ·· fa=xx fb=xx ··
  :
r1 n1:m1:s n1:1 5.01 ra ly=co a=0.2 fb=4 ··
r11 n1:1 n1:2 1.5 rb ly=m1 l=2 w=4 fa=0 ··
  :
r7 n1:2 n1:7 1.5 rb ly=m1 l=2 w=4 fa=1 ··
  :

ELECTRO-MIGRATION VERIFYING APPARATUS, ELECTRO-MIGRATION VERIFYING METHOD, DATA STRUCTURE AND NETLIST USED IN THE SAME

BACKGROUND OF THE INVENTION

1. Filed of the Invention

The present invention is related to an electro-migration verifying method of a semiconductor integrated circuit.

2. Description of the Related Art

In general, as factors for deteriorating reliability of semiconductor integrated circuits (LSIs), the electro-migration (EM) phenomenon is known. This electro-migration phenomenon implies that when a current flows through a wiring line, since electrons collide with atoms constituting the wiring line, the atoms are moved, and thus, an atomic array is deformed, so that a short circuit and/or a disconnection of the wiring line are conducted. Although the above-described electro-migration phenomenon itself is known since ancient times, very recently, this electro-migration phenomenon may cause a serious problem due to the following reasons: That is, since there is great progress in very narrowing process technology, semiconductor integrated circuits have been manufactured in very fine and current density has been more and more increased. As to deteriorations of the semiconductor integrated circuits caused by this electro-migration (EM) phenomenon, there are two types of deteriorations, namely, an instantaneous deterioration caused by instantaneous large currents, and a progressive deterioration caused by that currents flow therethrough for a long time. Thus, as technical ideas of simulating these deteriorations so as to verify the simulated results, electro-migration verification has been proposed.

The conventional electro-migration verification corresponds to such a method that a circuit simulation is carried out so as to calculate current density with respect to wiring lines and vias within a layout, and then, the calculated current density is compared with limit values of the current density for judgement purposes (refer to, for example, patent publication 1). Also, as circuit simulators and functions of P & R tools, the conventional electro-migration verification contains calculating functions of current density and functions of comparing/judging the calculated current density with the limit values of the current density (refer to, for instance, non-patent publication 1).

Patent Publication 1: JP-A-2005-251057

Non-patent Publication 1: US Synopsys company's tool "Hsimplus", "AstroRail", URL dated on Feb. 21, 2006 is URL:htto://www.synopsys.com.

Conventionally, a binary judgement has been carried out which judges whether or not current density of a specific portion within a layout exceeds a limit value of the current density; when the current density exceeds the limit value of the current density, this condition has been judged as "correction is required"; and a layout correction has been carried out after electro-migration verification has been accomplished. In a so-called "signal wiring line" such as a wiring line between a driver cell and a load cell, even if a branch is present, normally, there is only one path of a current which flows between specific two points within a wiring line. If such a wiring line is employed, then the judgement of the conventional technique has no problem.

On the other hand, very recently, while mesh structures have been used in power supply wiring lines and the like, a plurality of such current paths are present that currents flow between two specific points within wiring lines. Then, even in such a case that a specific portion of a layout is disconnected, if other current paths are not disconnected, then there are some possibilities that the layout need not be corrected. Apparently, in order to achieve high reliability, layouts must be corrected in such a manner that a circuit disconnection does not partially occur. However, in LSIs of current deep sub-micron processes, congestion degrees of wiring lines are extremely high. Accordingly, there is no question that corrections of layouts may conduct increases of semiconductor chip areas. As a consequence, in wiring lines having current paths under redundant condition such as power supply wiring lines, disconnected portions of the wiring lines are correctly judged, and correction necessities of layouts are correctly judged, so that reductions of chip areas of LSIs can be realized, and at the same time, higher reliability of wiring lines thereof can be achieved.

However, the conventional electro-migration verification has the following problems. That is, such a case that a wiring line is partially disconnected and thus current paths are changed in a half way has not been modeled in the conventional electro-migration verification. As a result, especially, as to such a wiring line that a plurality of current paths are present, the disconnected portions cannot be correctly judged, but also, necessities of layout corrections cannot be correctly judged.

SUMMARY OF THE INVENTION

The present invention has been made to solve the above-described problem, and therefore, has an object to invent an electro-migration verifying method which especially becomes advantage with respect to such a wiring line as a power supply wiring line that a plurality of current paths are present so as to be capable of correctly judging a necessity of a layout correction. As a result, the electro-migration verifying method can make areas of LSIs small, and at the same time, can establish high reliability of wiring lines.

As a consequence, an electro-migration verifying apparatus, according to an aspect of the present invention, is featured by comprising: a data inputting process unit; a netlist updating process unit for updating a netlist which is constructed by a wiring line parasitic element and a device element based upon a current density limit value database, a characteristic variation database, and wiring line current information; a current density calculating process unit for calculating current density of the wiring line parasitic element from a device current and the updated netlist; a wiring line current information updating process unit for updating the wiring line current information based upon the current density; a current density limit value comparing/judging process unit for judging whether or not a current density value is located within the current density limit value based upon the updated wiring line current information and the current density limit value database; and a result outputting process unit for performing an electro-migration verifying process operation by employing a step judging unit for judging a repetition process operation from step information, and also for outputting a result of the electro-migration verifying process operation based upon the output of the step judging process unit.

Also, an electro-migration verifying method, according to another aspect of the present invention, is featured by such an electro-migration verifying method including a data inputting process step; an electro-migration verifying process step; and a result outputting process step for outputting a result of the electro-migration verifying process step; in which the electro-migration verifying process step is comprised of: a step updating process step for judging a repetition from step information; a netlist updating process step for updating a netlist which is constructed by a wiring line parasitic element and a device element based upon a current density limit value database, a characteristic variation database, and wiring line current information; a current density calculating process step for calculating current density of the wiring line parasitic element from a device current and the updated netlist; a wiring line current information updating process step for updating the wiring line current information based upon the current density; and a current density limit value comparing/judging process step for judging whether or not a current density value is located within the current density limit value based upon the updated wiring line current information and the current density limit value database.

In accordance with the above-described arrangement, in particular, necessities of layout corrections with respect to such a wiring line as a power supply wiring line that a plurality of current paths are provided can be correctly judged. As a result, chip areas of LSIs can be made small, and at the same time, higher reliability of wiring lines can be realized.

BRIEF DESCRIPTION OF THE DRAWINGS

FIG. 6 is a diagram for indicating a current calculating formula.

FIG. 7 is a diagram for indicating an example as to wiring lien current information of T=1.

FIG. 8 is a diagram for indicating an example as to wiring lien current information of T=2.

FIG. 9 is a diagram for showing an example as to a current density limit value database.

FIG. 19 is a diagram for indicating an example as to step information.

DESCRIPTION OF THE PREFERRED EMBODIMENTS

Referring now to drawings, a description is made of embodiments of the present invention.

First Embodiment

Figure 1:
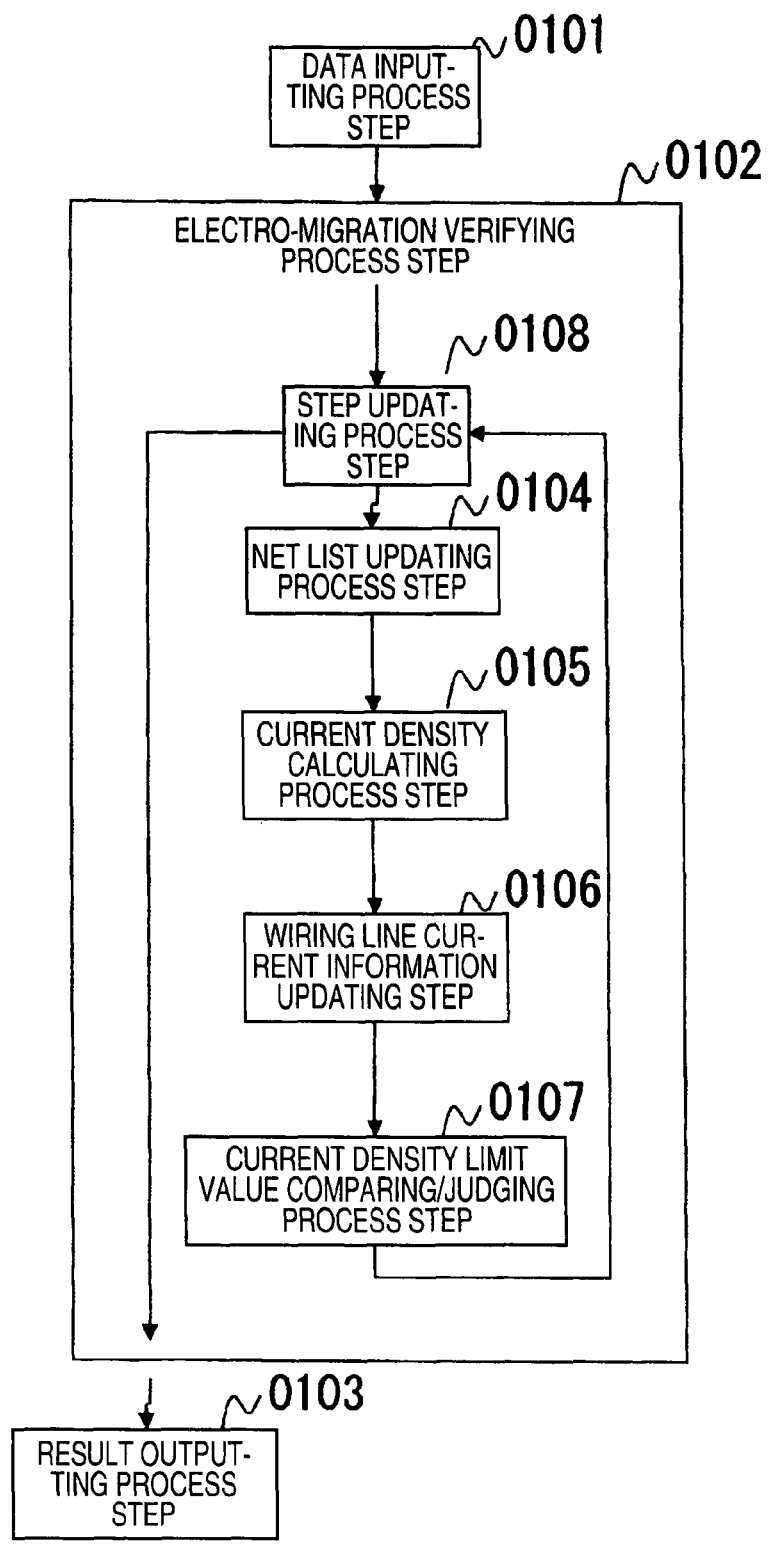
FIG. 1 is a flow chart for explaining an electro-migration verifying method according to an embodiment of the present invention.
Figure 2:
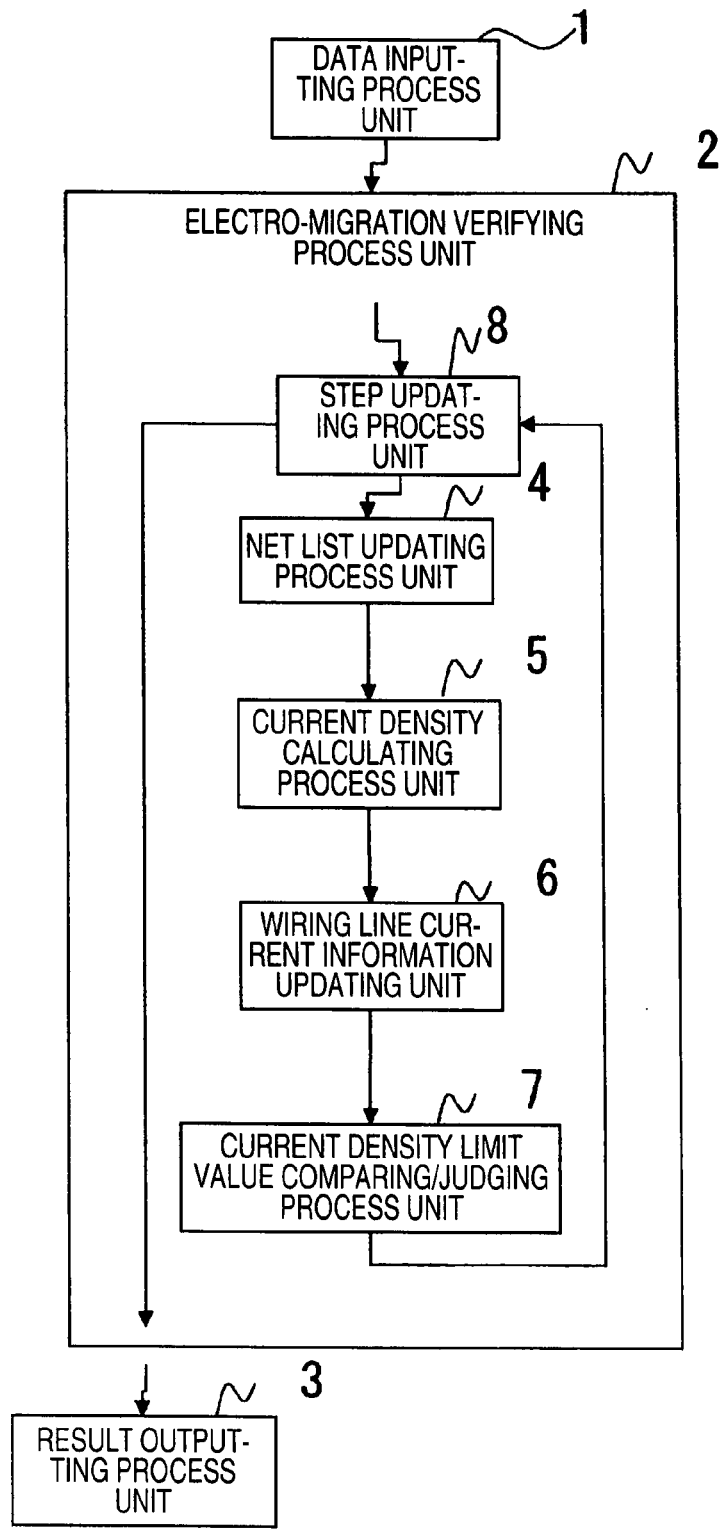
FIG. 2 is a block diagram for representing an electro-migration verifying apparatus according to the embodiment of the present invention.

FIG. 1 shows respective processing operations that constitute a first embodiment of the present invention. FIG. 2 is a block diagram for schematically representing an electro-migration verifying apparatus employed in the above-described process operations. The electro-migration verifying apparatus, according to the first embodiment of the present invention, is provided with a data inputting process unit 1, an electro-migration verifying process unit 2, and a result outputting process unit 3 for outputting a result of the electro-migration verifying process operations. The above-described electro-migration verifying process unit 2 is featured as follows: That is, the electro-migration verifying process unit 2 is equipped with a step updating process unit 8, a netlist updating process unit 4, a current density calculating process unit 5, a wiring line current information updating process unit 6, and a current density limit value comparing/updating process unit 7. The step updating process unit 8 performs a repetition judgement from step information. The netlist updating process unit 4 updates a netlist constituted by parasitic elements of wiring lines and device elements based upon a current density limit value database, a characteristic variation database, and wiring line current information. The current density calculating process unit 5 calculates current density of the wiring line parasitic elements from a device current and the updated netlist. The wiring line current information updating process unit 6 updates the wiring line current information based upon the current density. The current density limit value comparing/judging process unit 7 judges whether or not current density is present within the limit value based upon the updated wiring line current information, and the current density limit value database. This electro-migration verifying unit 2 performs an electro-migration verifying operation by employing the above-explained respective processing units, and the result outputting process unit 3 outputs a result of the above-explained electro-migration verifying process operation based upon the output of the current density limit value comparing/judging process unit 7. These process operations may be realized by a storage apparatus such as a general-purpose memory, an input apparatus such as a keyboard, and a CPU.

Then, an electro-migration verifying method, according to the first embodiment of the present invention, is executed by employing the above-described electro-migration verifying apparatus so as to verify inputted data such as a netlist by a data inputting process step 0101 and an electro-migration verifying process step 0102. Then, an electro-migration verification result obtained in this electro-migration verifying process step 0102 is outputted by a result outputting process step 0103.

It should be understood that the above-described electro-migration verifying process step 0102 is constituted by a step updating process step 0108 (first process operation), a netlist updating process step 0104 (second process operation), a current density calculating process step 0105 (third process operation), a wiring line current information updating process step 0106 (fourth process operation), and a current density limit value comparing/judging process step 0107 (fifth process operation).

Figure 21:
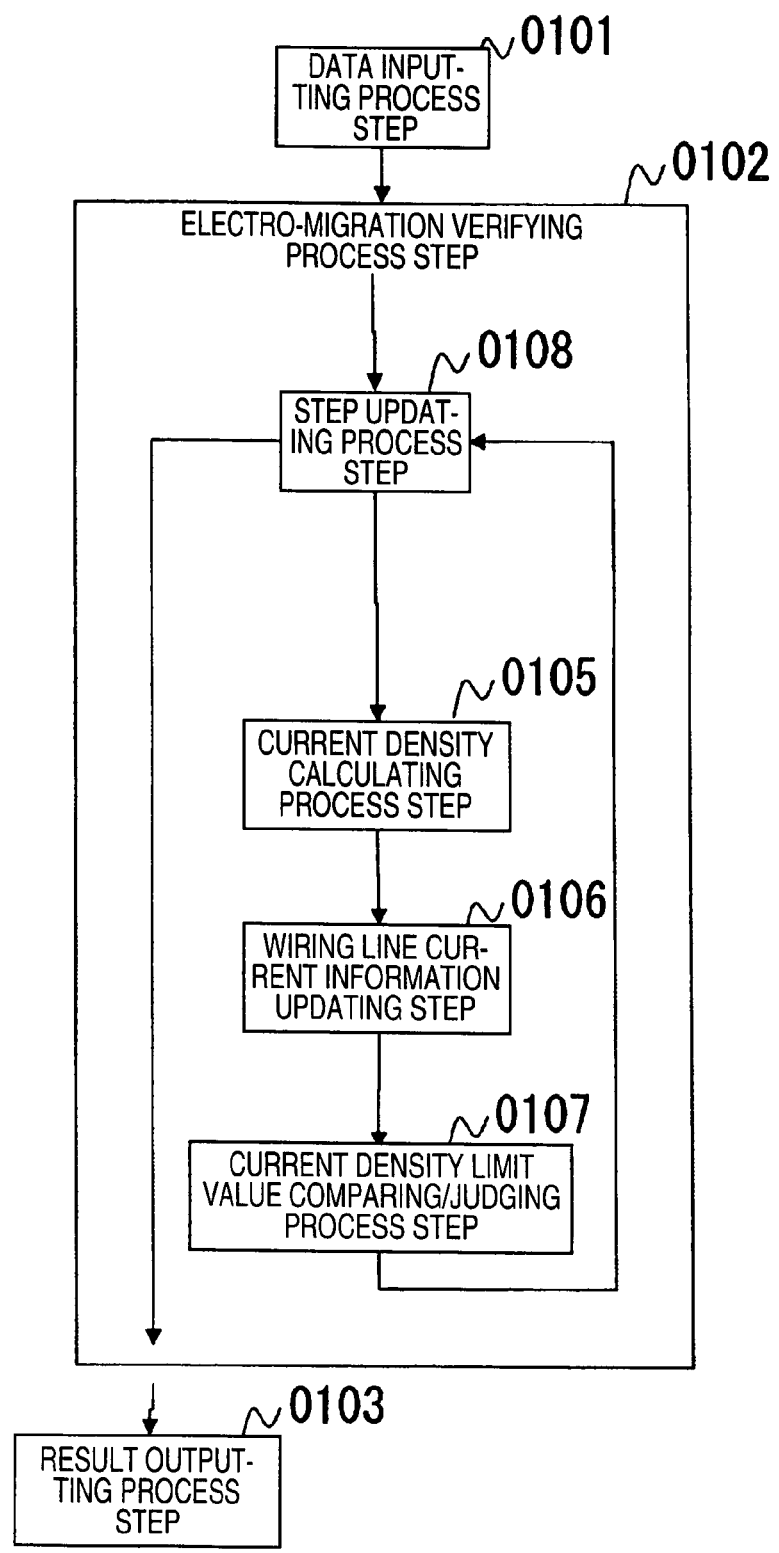
FIG. 21 is a flow chart for representing the conventional electro-migration verifying method.

FIG. 21 shows a relationship among respective process operations which construct a conventional electro-migration verifying method. As apparent from a comparison between FIG. 1 and FIG. 21, the conventional electro-migration verifying method does not contain the above-described netlist updating process step 0104. In contrast thereto, the electro-migration verifying method of the first embodiment of the present invention is featured by containing this netlist updating process step 0104.

Figure 3:
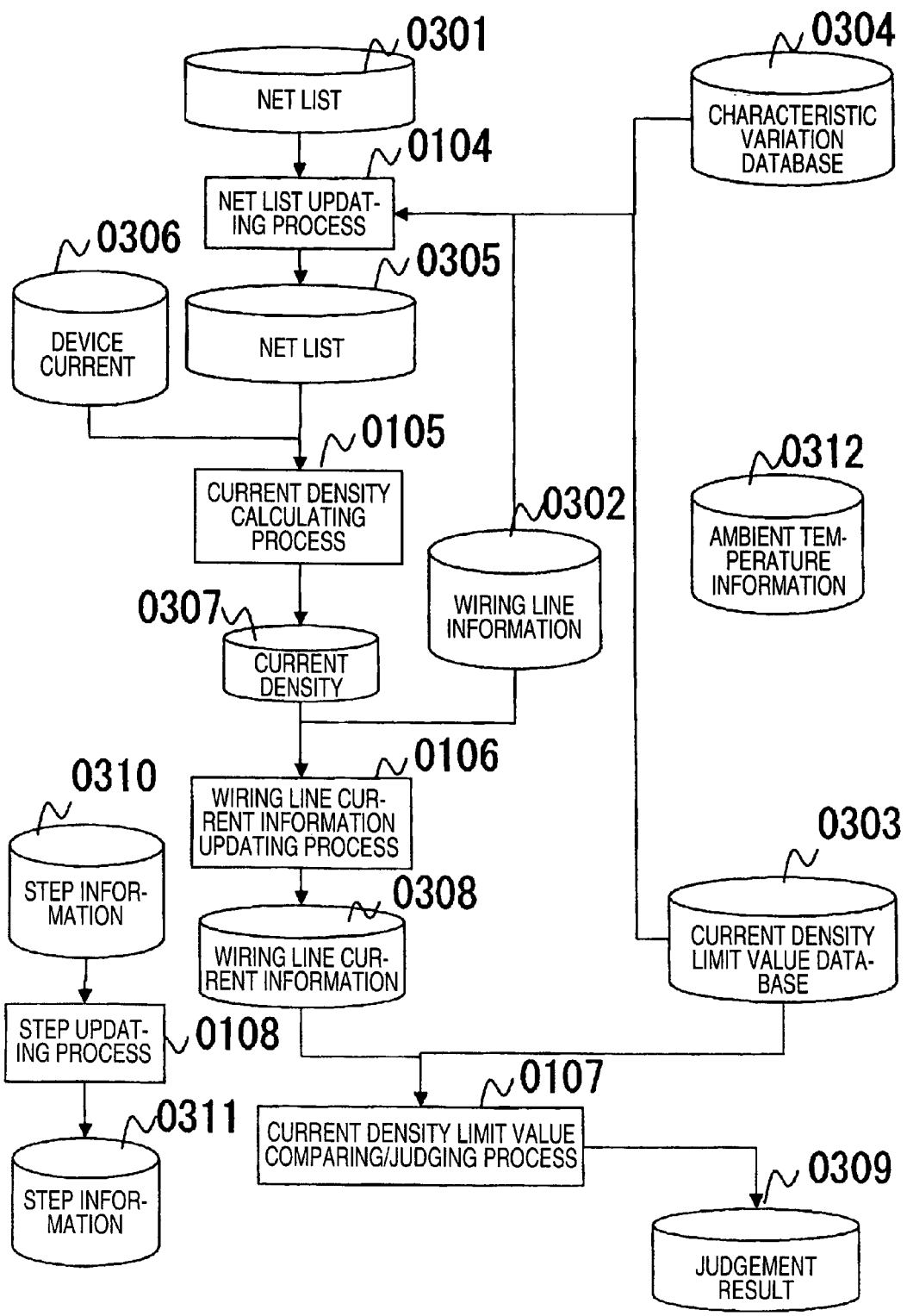
FIG. 3 is a diagram for representing data inputs/outputs in respective processing steps within an electro-migration verifying process step.

FIG. 3 shows inputs/outputs of data in the respective process operations defined from the first process operation to the fifth process operation within the electro-migration verifying process steps.

Figures 4, 5:
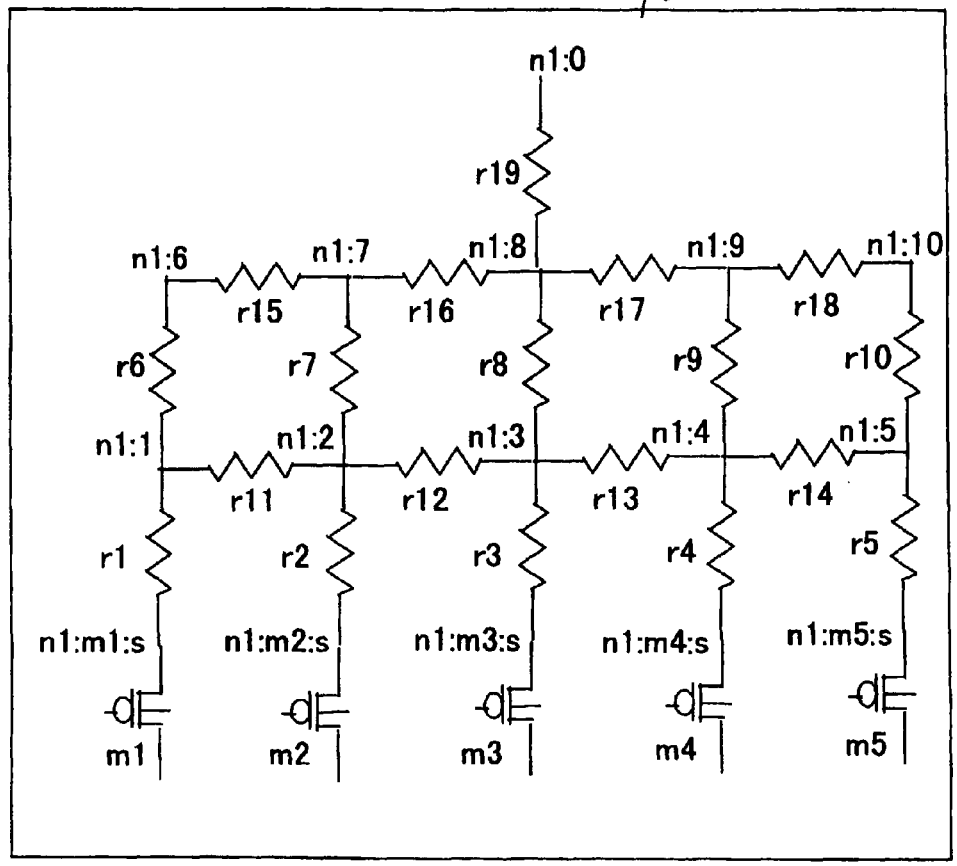
FIG. 4 is a diagram for indicating an example of a model circuit diagram.
FIG. 5 is a diagram for showing an example of a netlist.

FIG. 4 is a model circuit diagram 0401 which is prepared for explaining the present invention. The model circuit diagram 0401 has been constituted by a wiring line n1; wiring line parasitic elements r1, - - - , r19 of the wiring line n1; device elements m1, - - - , m5 connected to the wiring line n1; and sub-nodes n1:0, - - - , n1:10, n1:m1:s, - - - , n1:m5:s.

Referring now to FIG. 3 and FIG. 4, a description is made of the electro-migration verifying method according to the first embodiment of the present invention.

Firstly, the data inputting process step 0101 is performed by which the respective data as to a netlist 0301, a device current 0306, a current density limit value database 0303, a characteristic variation database 0304, and step information 0310 are captured to a computer program of the electro-migration verifying process operation, while these data have been stored in a storage apparatus such as a memory, or these data are inputted by an input apparatus such as a keyboard.

An example of the netlist 0301 shown in FIG. 3 is represented as a netlist 0501 in FIG. 5 in a concrete manner. The netlist 0501 has connection information as to device elements and wiring line parasitic elements. Concretely speaking, as indicated in the model circuit diagram 0401, the device elements have been connected to the wiring line parasitic elements. Each of the device elements contains an element name Xm1; a terminal name n1:m1:s; a device sort m1; shape information I, w; and peripheral shape information fc, fd. Each of the wiring line parasitic elements contains an element name r1; a terminal name n1:m1:s; a physical layer ly=m1; an impedance 5 ohm; a device sort ra; shape information a, I, w; and peripheral shape information fa, fb.

Figure 16:
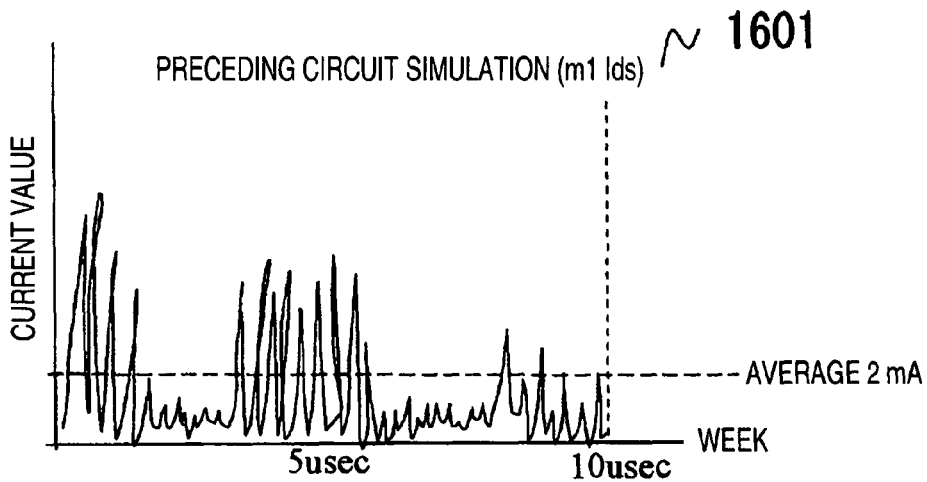
FIG. 16 is a diagram for representing an example as to a current model.
Figure 16:

One example of the device current 0306 shown in FIG. 3 is indicated as a device current 1602 of FIG. 16. The device current has been previously calculated every device element by a circuit simulation 1601, a logical simulation, or an RTL simulation based upon the electro-migration verification.

One example of the current density limit value database 0303 shown in FIG. 3 is indicated by a current density limit value database 0901 which is expressed by a condition branching formula of FIG. 9. A current density limit value database corresponds to relative information between a temperature and either an instantaneous current density value or an integrated current density value with respect to each of physical layers when a wiring line is brought into a disconnected line.

Figure 14:
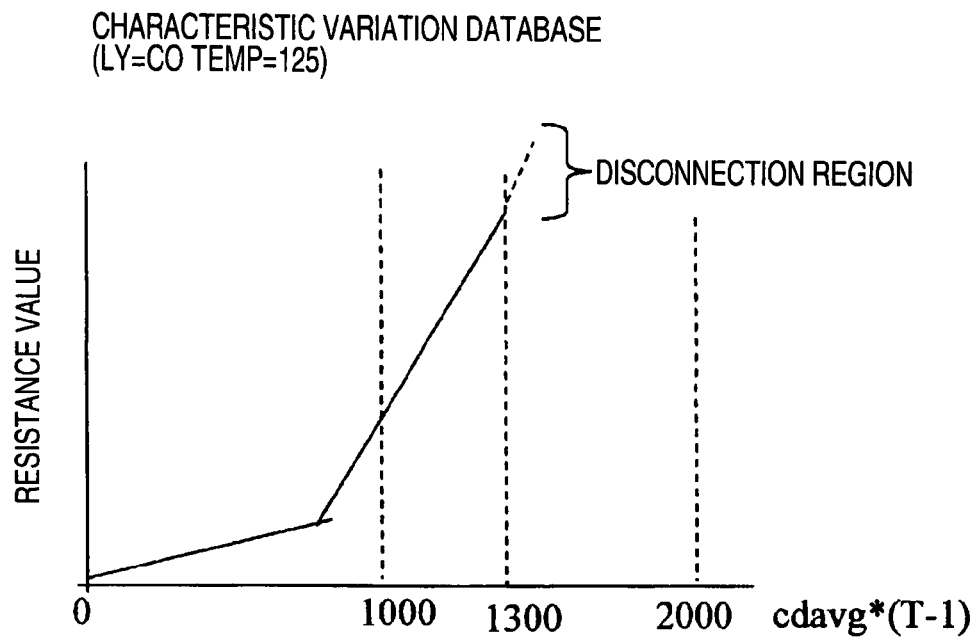
FIG. 14 is a diagram for showing an example as to a characteristic variation database.
Figure 14:
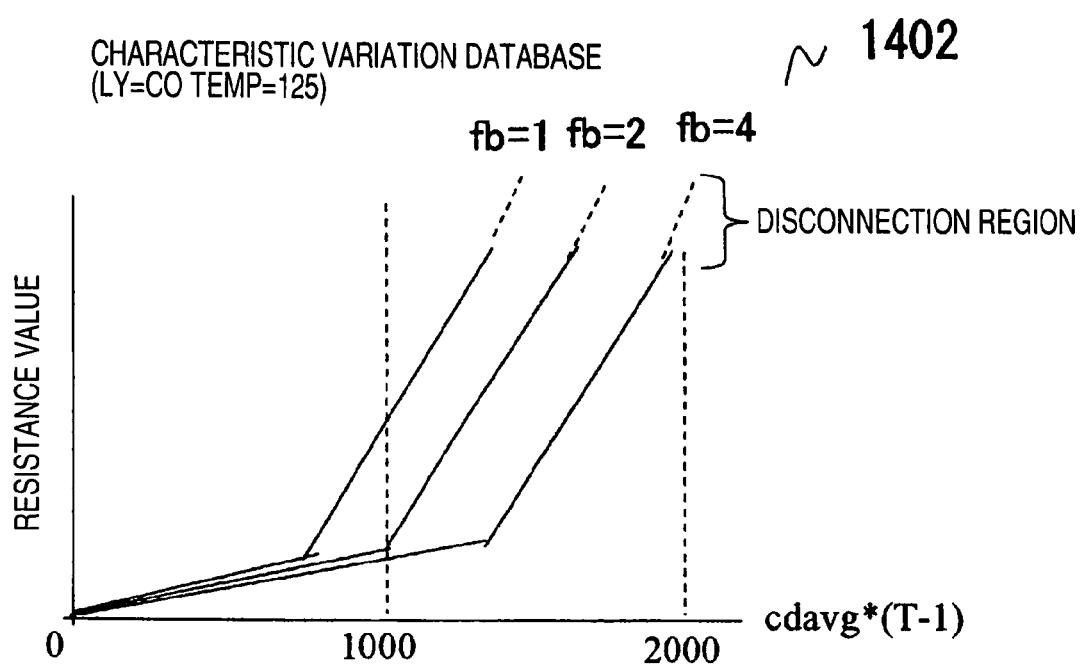

One example of the characteristic variation database 0303 shown in FIG. 3 is indicated by a characteristic variation database 1401 which is represented in FIG. 14. The characteristic variation database corresponds to relative information between a temperature and either an instantaneous current density value or an integrated current density value with respect to each of physical layers when a wiring line is brought into a characteristic variation.

One example of the step information 0310 is indicated by step information 1901 shown in FIG. 19. The step information is constituted by a step T, a unit step time period T_UNIT, a start T_START, an end T_END, and a step interval T_STEP. In the example of the step information 1901, the step information is given as T=0 (zeroth time), T_UNIT=1M (one month), T_START=1 (first month), T_END=120 (120th month), and T_STEP=1 (every one month). As a result, the following setting conditions, as to the electro-migration verification are made based upon the step information 1901: That is, the electro-migration verifying operations of 120 steps (namely, 10 years) are carried out from the first month up to the 120th month every 1 month.

As the peripheral temperature information 0312, it is so assumed that 125° C. is inputted.

After the data inputting process step 0101, the electro-migration verifying method is subsequently advanced to the electro-migration verifying process step 0102. Internal process operations (first process operation to fifth process operation) of the electro-migration verifying process step 0102 will now be explained in a sequential manner.

First of all, the step updating process step 0108 (first process operation) is carried out. In this step updating process step 0108, the step T is changed from 0 to T_START setting value 1; the step information 1901 is updated as step information 1902; and a first step is commenced.

Next, the netlist updating process step 0104 (second process operation) is carried out. Since T=T_START, the wiring line current information 0302 is not present at this time, so that the netlist updating process step 0104 is omitted.

Next, the current density calculating process step 0105 (third process operation) is carried out. In the first embodiment, while the device current 1602 has been inputted as a current model 1603 of the SPICE format, a current flowing through a wiring line parasitic element is calculated in combination with a netlist 1604, and then, current density 0307 is calculated. Concretely speaking, a current 2 mA of "m1" flows through a wiring line parasitic element "r1", and this current 2 mA is divided by a=0.2 um$^2$, so that the current density becomes 10 mA/um$^2$. Similarly, current density of other wiring line parasitic elements are sequentially calculated. In this current density calculating process step, an SPICE simulator, a gate level simulator, and an RTL simulator may be alternatively employed.

Next, the wiring line current information updating process step 0101 (fourth process operation) is carried out. As represented in FIG. 4, an average current "iaveg", an averaged current density value "cdavg", an instantaneous current "imax", an instantaneous current density value "cdmax", an effective current "irms" with respect to each of the wiring line parasitic elements are recorded as the wiring line current information. The above-described respective values are calculated based upon generally known calculation formulae of 0601, 0602, 0603, 0604, 0605, 0606, and 0607. It should also be noted that instead of the averaged current density value, such an integrated current density value may be alternatively recorded which is obtained by multiplying the averaged current density value by a step number. As one example shown in FIG. 7, wiring line current information 0308 (0701 as concrete example) is formed in the above-described manner.

Next, the current density limit value comparing/judging process step 0107 (fifth process operation) is carried out. Now, as shown in FIG. 9, a current density limit value of a metal wiring line "m1" has been given in a current density limit value database 0901, and 125° C. has been inputted as peripheral temperature information. A description is made of the current density limit value comparing/judging process step 0107 based upon a wiring line parasitic element r11 of the metal wiring line m1. An average current density value and an instantaneous current density value at a step T=1 of the element r11 are cdavg=6 mA/um, and cdmax=6 mA/um respectively from the wiring line current information 0701 (FIG. 7). On the other hand, from the current density limit value database 0901 (FIG. 9), an integrated current density value (will be referred to as "integrated current density limit value" hereinafter for discrimination purpose) of the metal wiring line m1 is cdavg_th=1400 mA/um, and an instantaneous current density value (will be referred to as "instantaneous current density limit value" hereinafter for discrimination purpose) thereof is cdmax_th 350 mA/um. With respect to the integrated current density limit value, comparing/judging operations are performed based upon the averaged current density value and the integrated current density value obtained by multiplying this average current density value by the step number. Since the step T=1 at this stage, the integrated current density value is 6 mA/um and 6 mA/um<1400 mA/um, it is so judged that this integrated current density value of 6 mA/um is small than, or equal to the limit value. With respect to the instantaneous current density limit value, comparing/judging operations are carried out for the instantaneous current density value. Since the instantaneous current density value is 6 mA/um<350 mA/um, it is so judged that this instantaneous current density value is small than, or equal to the limit value.

The electro-migration verifying process steps constituted from the above-described first process operation to fifth process operation are repeatedly carried out plural times equal to a total step number. Subsequently, electro-migration verifying process steps of the second step will now be described in a sequential manner.

Firstly, a step updating process step 0108 (first process operation) is carried out. In the step updating process step 0108, the present step is increased from the step T=1 by T_STEP, as indicated in FIG. 19, the present step becomes a step T=2, and is updated as indicated by step information 1903. Next, the step T is compared with the end T_END, and then, if T>T_END, then the electro-migration verifying process step 0102 is ended, and the verifying process operation is advanced to the result output processing step 0103. However, in the second step, since T≦T_END, the verifying process operation is advanced to a netlist updating process step 0104 (second process operation).

Figure 20:
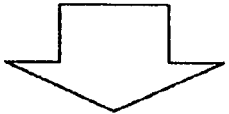
FIG. 20 is a diagram for showing an example as to updating of a netlist.

Next, the netlist updating process step 0104 (second process operation) is carried out. As the wiring line current information 0302, the wiring line current information 0308 formed in the first step is used. First of all, both the wiring line current information 0302 is compared with the current density limit value database 0303. In this step, it is so judged that a current density value is smaller than, or equal to the limit value in a similar manner to the current density limit value comparing/judging process step 0107 of the first step, and does not exceed the current density limit value, so that a netlist is not updated. Next, the wiring line current information 0302 is compared with the characteristic variation database 0304. Now, a characteristic variation based upon an integrated current density value of a contact wiring line "co" has been given from the characteristic variation database 1401 (see FIG. 14), and 125° C. has been inputted as the ambient temperature information. A description is made based upon the wiring line parasitic element r1 of the contact wiring line "co." Since a characteristic variation occurred at the time when the first step has passed is considered, an integrated current density value of this wiring line parasitic element r1 is calculated as cdavg*T=20 mA/um²=20 mA/um² by calculating an integrated current density value by employing wiring line current information 0701. This calculated value is compared with the characteristic variation database 1401 so as to change the resistance value from 5Ω to 5.01Ω. A netlist before being changed is indicated by 2001, and a netlist after being changed is represented by 2002 in FIG. 20.

The netlist updating process step 0104 is accomplished in the above-described manner.

It should also be noted that as this netlist, such a netlist may be preferably employed which is provided with at least one of an element name, a physical layer, an impedance, a device sort, shape information, and peripheral shape information with respect to each of the wiring line parasitic elements, and also, which is provided with at least one of an element name, a device sort, an operating model, shape information, and peripheral shape information with respect to each of the device elements, and furthermore, which is provided with connection information between the wiring line parasitic element and the device element. Alternatively, the netlist may be provided with only any one of these items.

In addition, this netlist is provided with all information as to the element name, the physical layer, the impedance, the device sort, the shape information, and the peripheral shape information with respect to each of the wiring line parasitic elements; and also, which is provided with all of the element name, the device sort, the operating model, the shape information, and the peripheral shape information with respect to each of the device elements; and furthermore, which is provided with the connection information between the wiring line parasitic element and the device element. As a result, although there is no alternative way in the increase of the data amount, there is such an effect that the electro-migration verification can be carried out in an extremely correct degree, which cannot be compared with the increase of the data amount.

Next, a current density calculating process step 0105 (third process operation) is carried out. Since this process step is performed in a similar manner to that of the first step, a description thereof is omitted.

Next, a wiring line current information updating process step 0106 (fourth process operation) is carried out. Since this wiring line current information updating process step 0106 of the second step is carried out in a similar manner to that of the first step, a description thereof is omitted. The wiring line current information 0302 is updated from wiring line current information 0701 (refer to FIG. 7) of the first step to wiring line current information 0801 (refer to FIG. 8) of the second step.

Next, a current density limit value comparing/judging process step 0107 (fifth process operation) is carried out. Since this process step 0107 of the second step is similar to that of the first step, a description thereof is omitted.

While the wiring line current information, the step information, and the netlist are updated in the above-described manner, the electro-migration verifying process operation is carried out.

Next, a description is made of an example that the wiring line current information 0302 exceeds the limit value of the current density limit value database 0303 and thus a netlist is updated.

Figure 17:
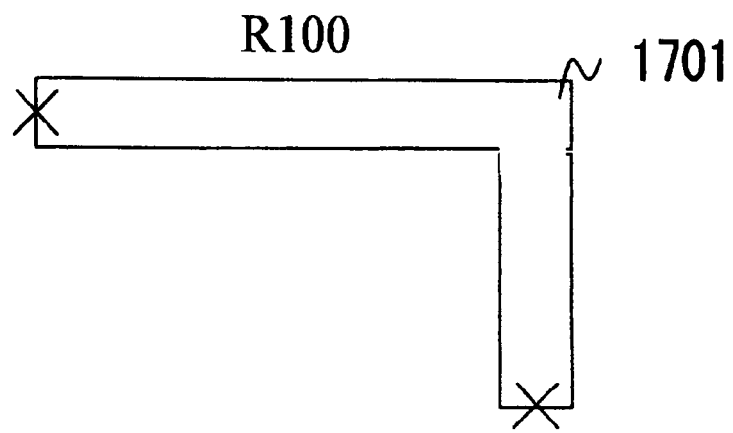
FIG. 17 is a supplemental explanation diagram of shape information "fa."
Figure 17:
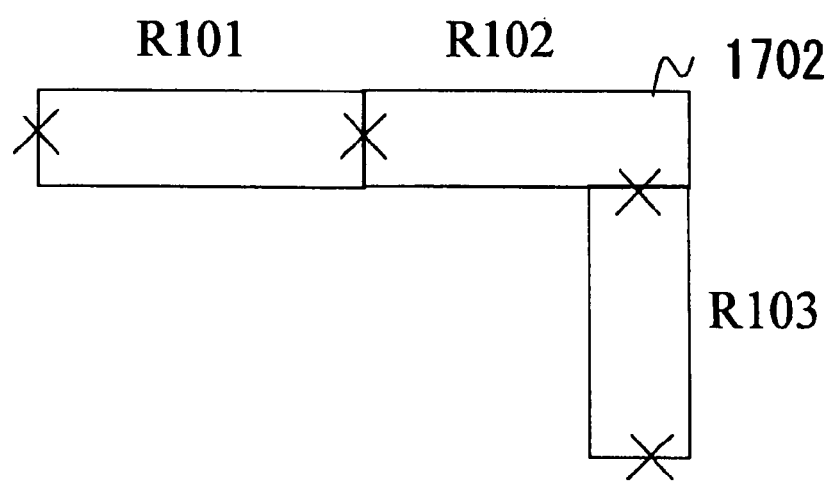

In the first embodiment, the above example will now be explained by employing a wiring line parasitic element r7. The wiring line parasitic element r7 has a parameter of fa=1 as shown in a netlist 0501. The parameter "fa" is one of the shape information of the metal wiring line, and expresses a total number of bent wiring lines. FIG. 17 explains bending of wiring lines. Normally, a netlist having a wiring line parasitic element is extracted from layout data in accordance with a parasitic element program called as "LPE" so as to be produced. At this time, while expressing methods for bent portions of the netlist are different from each other, depending upon the LPE program, there are the below-mentioned two cases: In one case, as represented in a layout 1701, a parasitic resistance element R100 having a bent portion is extracted. In another case, as represented in a layout 1702, a resistor is divided at a bent portion, so that parasitic resistance elements R102 and R103 are extracted. Assuming now that any of the above-described cases of R100, R102, R103 contains a bent number 1, such a fact that wiring line parasitic information has such a bent information as fa=1 is referred to as a netlist feature.

Furthermore, concretely speaking, if the current density limit value database 0303 is given depending upon the condition sort by "fa" as shown by 0902 in FIG. 9, then a current density limit value of electro-migration and a characteristic variation amount may be applied in response to a fact for indicating whether or not bending of a metal wiring line is present, so that the electro-migration verification can be carried out in high precision. In the first embodiment, it is so assumed that the current density limit value database is given as 0902. Also, it is so assumed that as the ambient temperature information, 125° C. has been similarly entered.

It should be understood that the current density limit value database 0303 has such a data structure which is constituted by any one of a formula, a table model, a graph, and a condition branching sentence, or a combination of these items. Accordingly, since a proper data structure is used, a storage capacity of the database 0303 may be reduced; a processing time for a netlist updating process step may be reduced; and a memory amount used in the netlist updating process step may be reduced.

Figures 10, 11:
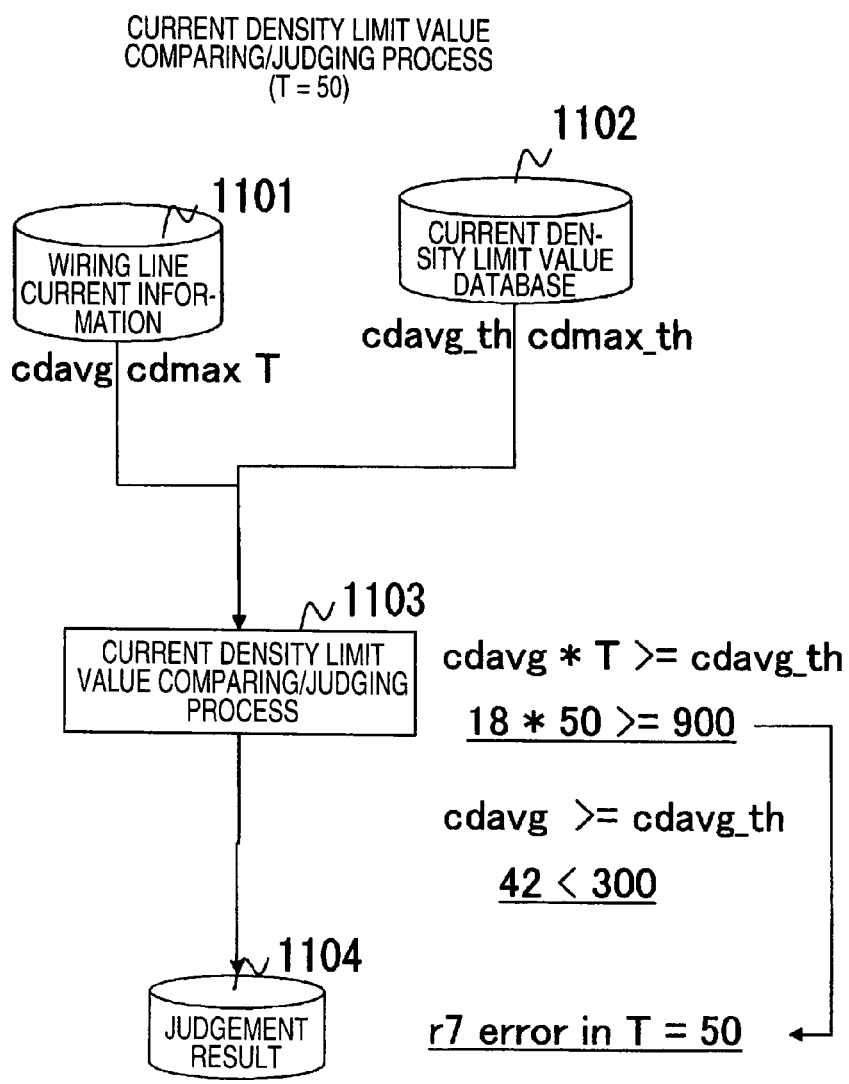
FIG. 10 is a diagram for representing an example as to wiring line current information of T=50.
FIG. 11 is a supplemental explanation diagram as to a current density limit value comparing/judging process step of T=50.

It is now assumed that a wiring line current information updating process step (fourth process operation) of a 50th step is accomplished and the wiring line current information is updated as such a netlist 1001 as shown in FIG. 10. Next, a current density limit value comparing/judging process step (fifth process operation) of the 50th step is carried out. FIG. 11 is an explanatory diagram for explaining this fifth process operation. In a netlist updating process step (second process operation) of a 51st step, wiring line current information 1001 is compared with a current density limit value database 0902. An averaged current density value and an instantaneous current density value of the wiring line parasitic element r7 at the 50th step are given as cdavg=18 mA/um and cdmax=42 mA/um from the wiring line current information 1001. On the other hand, since fa=1, an integrated current density limit value of a metal wiring line m1 is cdaveg_th=900 mA/um, and an instantaneous current density limit value thereof is cdmax_th=300 mA/um, which correspond to comparison subjects from the current density limit value database 0902. With respect to the integrated current density limit value, the averaged current density value is compared/judged with an integrated current density value obtained by multiplying the averaged current density value by a total step number. Since the present stage is the step T=50, an integrated averaged current density value is 900 mA/um, and thus, reaches the integrated current density limit value of 900 mA/um. As a result, it is so judged that the wiring line parasitic element r7 is an error which is outputted as a judgement result 0309. The instantaneous current density value is compared with the instantaneous current density limit value. Since 42 mA/um<300 mA/um, the instantaneous current value is located within the limit value.

Figure 12:
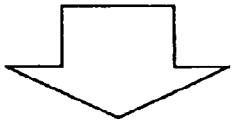
FIG. 12 is a diagram for showing an example as to updating of a netlist.

Next, the verifying process operation is advanced to the netlist updating process step (second process operation) of the 51st step. In this step, the status at the time when the 50th step is ended is reflected to the netlist. Similar to the current density comparing/judging process step of the 50th step, since the wiring line current information 1001 is compared with the current density limit value database 0902, a similar judgement result is obtained. However, instead of outputting the judgement result at 0309, the netlist is updated. On example of the netlist updating process step is represented. In the example of FIG. 12, assuming now that the wiring line parasitic element r7 has been disconnected, this element r7 is deleted from the netlist. In other words, in a netlist 1202 after the netlist updating process operation is carried out, the data about the wiring line parasitic element r7 is deleted from the netlist 1201 before the netlist updating process operation is carried out. Since the above-explained data deletion is carried out, electro-migration verifying process operation may be carried out under such a condition after the current path has been changed due to the disconnection of the wiring line from a step subsequent to the 51st step. Although a netlist structure intercepting program (parser) must be re-executed, since the wiring line network is decreased, a total calculation number and a total calculation time can be shortened.

Second Embodiment

Next, as a second embodiment of the present invention, a description is made of another example as to the netlist updating process step with reference to FIG. 4. Assuming now that the element "r6" is deleted by the netlist updating process step, the sub-node n1:6 is released, and becomes such a node (will also be called as "dangling node") which has been connected only one element. Moreover, if the elements r7 and r16 are deleted, then the sub-nodes n1:6 and n1:7 become such nodes (will also be called as "floating nodes") which do not have a DC path. There are some possibilities that these nodes may give an adverse influence, for example, the converging characteristic of the SPICE simulator is deteriorated. If such a netlist updating process step capable of reducing the adverse influence given to the simulation by executing a process operation for fixing a potential at the same time when a deleting process operation of a wiring line resistance element is executed with respect to these nodes, then an advantage may be achieved.

Third Embodiment

Figure 13:
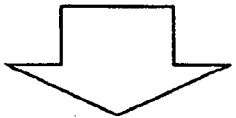
FIG. 13 is a diagram for showing an example as to updating of a netlist.

As a third embodiment of the present invention, FIG. 13 shows a further example as to the netlist updating process step. The updating process step of FIG. 13 corresponds to such a method that while a netlist 1301 is updated as another netlist 1302 after the updating process step is carried out, since the resistance value of the resistance element r7 is made high, for example, 1 giga ohm, this resistance element r7 may not essentially become a current router. Different from the second embodiment shown in FIG. 12, the re-execution of the program (parser) is no longer required, and this changing method becomes an effective method in such a case that the processing time of the program "parser" is long. Alternatively, if such a simulation using a function model is realized, then any method may be employed which changes the operating model in such a manner that the relevant wiring line parasitic element does not constitute the current path.

Fourth Embodiment

As a fourth embodiment of the present invention, a description is made of another example in which a netlist is updated based upon a characteristic variation.

Figure 18:
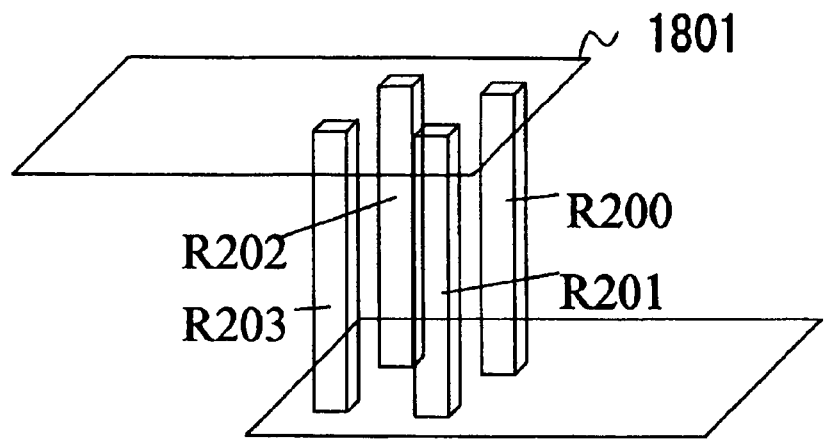
FIG. 18 is a supplemental explanation diagram of shape information "fb."
Figure 18:
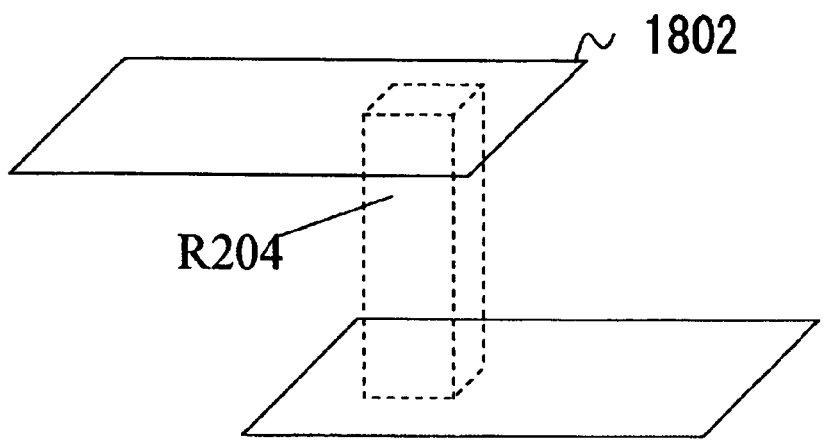

In this fourth embodiment, the example is explained with employment of the wiring line parasitic element r1. The wiring line parasitic element r1 has a parameter of fb=4 such as a netlist 0501. Symbol "fb" corresponds to one of shape information about a contact and a via, and peripheral shape information, and indicates a via array number. The via array number will now be explained with reference to FIG. 18. As previously described, such a netlist having a wiring line parasitic element is extracted and formed by an LPE program. At this time, while methods of expressing via array numbers of the netlist are different from each other, depending upon LPE programs, there are the below-mentioned two cases: namely, in one case, as represented as a layout 1801, parasitic resistance elements R200, R201, R202, and R203 are extracted with respect to each of contacts and vias; and in the other case, as represent as a layout 1802, via arrays are condensed to be extracted as one parasitic resistance element R204. Assuming now that the via arrays of 2×2=4 are contained in any one of these cases, the netlist is featured by that the wiring line parasitic information has such an information of fb=4.

Furthermore, for example, as indicated by 1402 in FIG. 14, if the characteristic variation database 0304 is given depending upon the condition sort by "fb", then a current density limit value and a characteristic variation amount of electro-migration in response to the via array number can be applied, so that the electro-migration verifying operation can be carried out in high precision.

It should also be noted that the characteristic variation database 0304 corresponds to such a data structure which has been arranged by any one of a formula, a table model, a graph, and a condition branching sentence, or by a combination of these items. Accordingly, since a proper data structure is used, a storage capacity of the database 0303 may be reduced; a processing time for a netlist updating process step may be reduced; and a memory amount used in the netlist updating process step may be reduced.

In the netlist updating process step, in such a case that a characteristic variation is compared with wiring line current information and then the characteristic variation is reached, one, or more pieces of an impedance, a device sort, shape information, and peripheral information of the relevant wiring line parasitic element is changed. Since a concrete sequence is similar to that of a current density limit value database, explanations thereof are omitted.

As concrete examples of the current density limit value data base and the characteristic variation database, the following items may be given except for the previously explained "fa" and "fb", namely, shapes and intervals of via arrays, projection amounts (will also be called as "overlap") between vias and metal wiring lines, and branching number of wiring lines may be given every shape information and peripheral shape information. Since the netlist contains the shape information and the peripheral shape information, the netlist may be properly updated, so that the electro-migration verifying process operation may be carried out in high precision.

Moreover, while the current density limit value and the characteristic variation database are given with respect to each of the impedances, the device sorts, and the operation models of the wiring line parasitic elements, the netlist has the impedance, the device sort, and the operation model. As a result, the netlist can be properly updated in response to the close condition, and the electro-migration verifying operation can be carried out in high precision. For instance, as to the impedance, since such an operating model is employed which is changed, or is changed at the same degree with that of the change, the wiring line parasitic element may be modified in order not to constitute a current path.

Fifth Embodiment

Next, a description is made of a method for detecting a disconnection of a wiring line which may give a fatal error as a fifth embodiment of the present invention.

The fifth embodiment is featured by that a netlist comparing process step (sixth process operation) for comparing a netlist before a netlist updating process operation is performed with a netlist after the netlist has been updated is carried out either after a designated step has been accomplished or every time each of the steps is accomplished. Concretely speaking, the netlist comparing process step uses a general-purpose LVS (Layout-Versus-Schematic) program as such a program for comparing a layout with a circuit. Referring now to FIG. 4, a disconnection of a wiring line which gives a fatal error will be explained. While any of the resistance elements r1, r2, r3, r4, r5 shown in FIG. 4 take roles of connections with device elements, if these resistive elements are disconnected, then electric power cannot be supplied to the device elements, so that the disconnections of the resistive elements give a fatal error. Similarly, if both the resistance elements r6 and r11 are disconnected, then the electric power to the device element m1 is cut off. In the LVS program, since an open of a device terminal can be detected, these fatal disconnections of the wiring lines can be detected. As previously described, the netlist comparing process step and the electro-migration processing step are carried out at the same time, so that the electro-migration verifying operation can be carried out in higher precision.

Sixth Embodiment

Next, a description is made of an electro-migration verifying method having a supporting function which is provided in order to properly correct a layout, as a sixth embodiment of the present invention.

The sixth embodiment is featured by that either a wiring line or a wiring line parasitic element is designated in which a netlist is not updated by a characteristic variation, and a disconnection of the wiring line. Since either the wiring line or the wiring line parasitic element whose electro-migration durability is wanted to be emphasized is designated so as to be electro-migration-verified, a layout correcting effect can be virtually predicted, while a layout correcting process operation is not actually carried out and a proper layout correcting portion can be investigated within a short time.

Next, a description is made of a method for improving a debugging efficiency of an electro-migration verifying operation.

In this sixth embodiment, instead of the netlist 0301, a circuit diagram is inputted; and any one, or both of a netlist extracting process operation and a circuit diagram reconstructing process operation are merged into an electro-migration process program. The netlist extracting process operation extracts a netlist from the circuit diagram. The circuit diagram reconstructing process operation reconstructs a circuit diagram from the netlist. Since the netlist extracting process operation and the circuit diagram reconstructing process operation are carried out, a circuit diagram (corresponding to 0401) constitutes a user interface. As a result, a visual recognition can be improved, and affinity with respect to a circuit designing environment can be increased, so that the debugging efficiency of the electro-migration verifying operation can be improved. Similarly, instead of the netlist 0301, while layout data may be entered, any one, or both of an LPE process operation and a layout reconstructing process operation may be alternatively merged into the electro-migration processing program. The LPE process operation extracts a netlist from the layout data. The layout reconstructing process operation reconstructs layout data from the netlist. Since the LPE process operation and the layout reconstructing process operation are carried out, the layout constitutes a user interface. As a result, a visual recognition can be improved, and affinity with respect to a layout designing environment can be increased, so that the debugging efficiency of the electro-migration verifying operation can be improved.

Seventh Embodiment

Next, a description is made of an electro-migration verifying method capable of considering an aging effect of a device, as a seventh embodiment of the present invention.

The seventh embodiment is featured by that a characteristic variation in an aging effect of a device, which is caused by a hot carrier deterioration and a BT deterioration, is reflected to a device current. In the previous embodiment, as indicated in FIG. 16, currents having the same values which have been previously calculated every device element based upon the circuit simulation 1601, the logical simulation, or the RTL simulation, are used in the respective steps. Instead thereof, since the device current is varied in response to the characteristic variation of the device, the electro-migration verifying operation can be carried out in high precision. Also, referring now to the aging effect verification of the device and the electro-migration verification corresponding to the aging effect verification of the wiring line with each other, the process operations may be alternatively carried out in a cooperative manner, so that a total step number of the aging effect verification may be shortened.

Eighth Embodiment

Next, a description is made of a method for calculating a device current within an electro-migration verifying process operation, as an eighth embodiment of the present invention.

Figure 15:
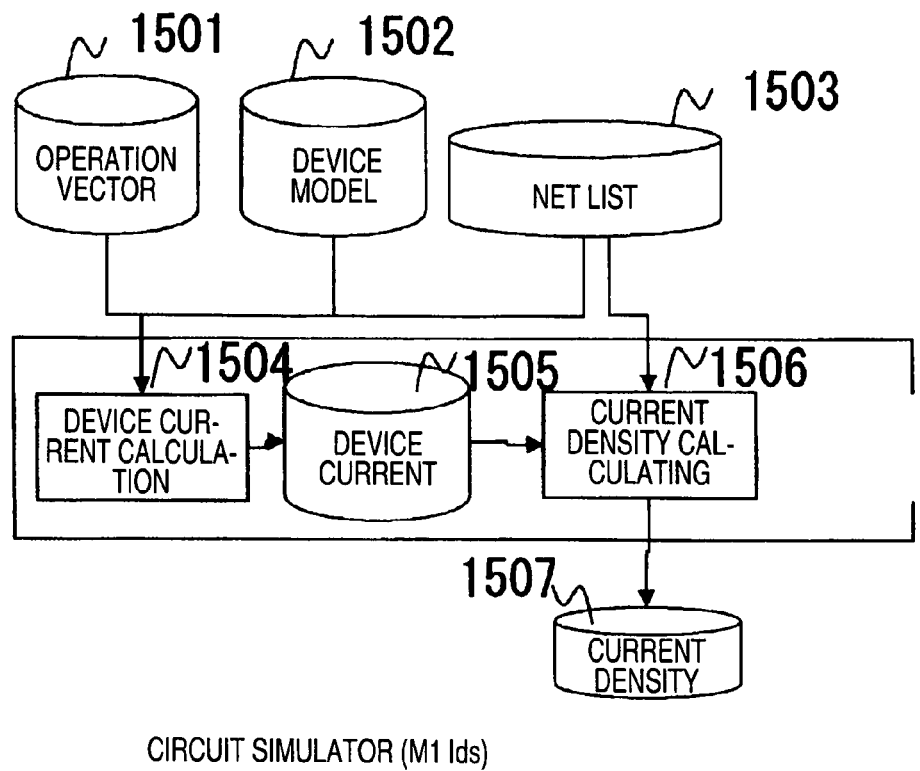
FIG. 15 is a diagram for indicating a modification of FIG. 3 in combination with a device current calculating process operation.
Figure 15:
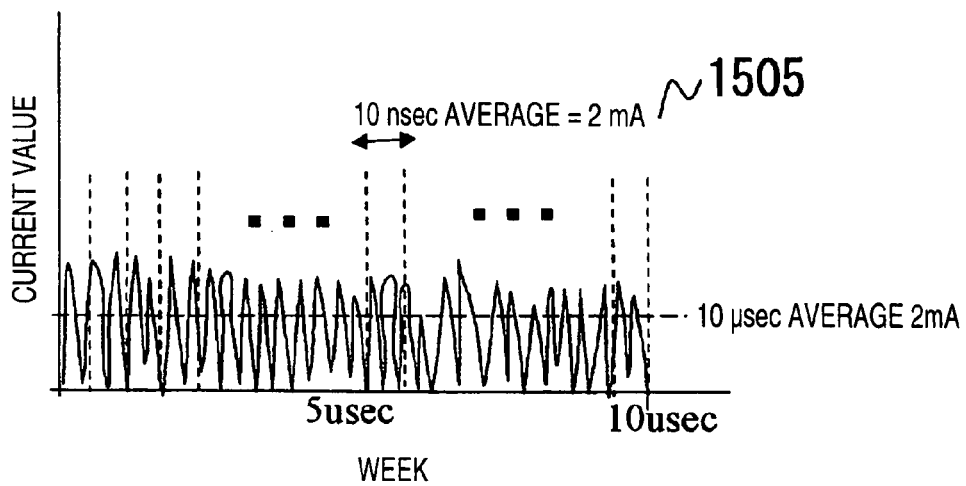

The eighth embodiment is featured by that a calculation of a device current is not performed before an electro-migration verifying operation, but is carried out together with the electro-migration verifying operation in a cooperative manner. Concretely speaking, as shown in a modification of FIG. 15, this eighth embodiment corresponds to such a method that both a current density calculating process operation and a device current calculating process operation are carried out in a cooperative manner by employing a circuit simulation, a logical simulation, an RTL simulation, and the like, which are widely employed even in the existing techniques such as the non-patent publication 1. In this method, a profile of a device current must be made stable as indicated by 1505 in FIG. 15. In such a case that a profile of a device current is fluctuated in an active term (operating mode) and in a non-active term (waiting mode) as indicated by 1601 in FIG. 16, a time step is not constant but steps must be varied in response to an integrated amount of a device current. However, the method of this eighth embodiment may have a merit capable of utilizing the existing techniques, and another merit that the calculation of the device current is not required in advance.

Ninth Embodiment

Next, a description is made of an electro-migration verifying method by considering a local temperature variation, as a ninth embodiment of the present invention.

The ninth embodiment is featured by that a local temperature variation is predicted based upon an effective current of a wiring line parasitic element. Assuming now that a temperature of the relevant wiring line parasitic element is "To", an ambient temperature (will also be called as "environmental temperature" hereinafter) is "Ts", a heat resistance is "Rw", and a heat amount is "P", generally speaking, the below-mentioned relative equation can be established:

$$To - Ts = Rw \times P$$

The heat resistance is determined based upon a material from the relevant wiring line up to a peripheral portion thereof. In an LSI, a heat resistance is determined based upon a conductor and an insulator in a silicon wafer, and a package, and the heat resistance can be given with respect to each of wiring line parasitic elements, or a constant value which is uniformly applied to the wiring line parasitic elements. Also, the heat amount can be calculated by a square of an effective current and a resistance value. As a consequence, the temperature "To" can be calculated from the previous relative formula. It should also be noted that if an ON-resistance of an MOS located near a position of a wiring line parasitic element is added to a heat amount calculation as a heat source, then higher calculation precision of the heat amount may be achieved. Since this temperature "To" is employed as such a temperature while referring to a current density limit value database and a characteristic variation database, an electro-migration verifying operation can be carried out in high precision.

The present invention is employed so as to design a semiconductor integrated circuit. As a result, it is possible to correctly judge a necessity of a layout correction with respect to, especially, such a wiring line that a plurality of current paths are provided, for instance, a power supply wiring line. Thus, an area of an LSI can be made small, and at the same time, higher wiring line reliability can be achieved.

What is claimed is:

1. An electro-migration verifying method performed by a computer, wherein:

the computer compares current density information about either a wiring line having a wiring line parasitic element or a device of a semiconductor integrated circuit calculated based on a netlist of the semiconductor integrated circuit with a predetermined limit value;

in a case where the computer determines that the current density information regarding the wiring line is larger than the predetermined limit value, the computer deletes wiring line parasitic element data of the wiring line from the netlist and updates the netlist for reflecting the deletion; and the computer compares the current density information about either the wiring line or the device of the semiconductor integrated circuit calculated based on the updated netlist with the predetermined limit value, again.

2. The electro-migration verifying method as claimed in claim 1, wherein said current density information is any one of an instantaneous current density value, an integrated current density value, an average current density value, and an effective current density value.

3. The electro-migration verifying method as claimed in claim 1, wherein:
the netlist includes another wiring line having a wiring line parasitic element,
in a case where the computer determines that the current density information regarding said another wiring line is larger than the predetermined limit value, the computer deletes said another wiring line from the netlist by deleting said wiring line parasitic element of said another wiring line, or by increasing a resistance value of said wiring line parasitic element of said another wiring line, and updates the netlist.

4. The electro-migration verifying method as claimed in claim 3, wherein the computer further deletes a floating wiring line which is produced by deleting said wiring line parasitic element of said wiring line from the netlist, or by fixing a potential of said floating wiring line to a fixed potential, and updates the netlist.

5. The electro-migration verifying method as claimed in claim 1, wherein:
the netlist includes another wiring line having a wiring line parasitic element, and
the computer changes at least one of an impedance value of said wiring line parasitic element of said another wiring line, an operating model of said semiconductor integrated circuit, shape information, and peripheral shape information of the wiring line parasitic element of said semiconductor integrated circuit, and updates the netlist.

6. The electro-migration verifying method as claimed in claim 5, wherein said peripheral shape information corresponds to information about a projection amount of a metal wiring line to which either a contact or a via is connected.

7. The electro-migration verifying method as claimed in claim 5, wherein said peripheral shape information corresponds to, in a case where said wiring line parasitic element of said another wiring line constructs a contact array or a via array, either an interval and a total quantity of contacts in said contact array, or an interval and a total quantity of vias in said via array.

8. The electro-migration verifying method as claimed in claim 5, wherein said peripheral shape information corresponds to a total number of bending portions possessed by said another wiring line.

9. The electro-migration verifying method as claimed in claim 5, wherein said peripheral shape information corresponds to presence or absence of wiring lines branched from said another wiring line and a total number of the branched wiring lines.

10. The electro-migration verifying method as claimed in claim 3, wherein said netlist is updated except for either a designated wiring line or a designated wiring line parasitic element.

11. A netlist employed in the electro-migration verifying method recited in claim 1 wherein said netlist is provided with all of information as to an element name, a physical layer, an impedance, device information, shape information, and peripheral shape information with respect to each of wiring line parasitic elements of a semiconductor integrated circuit; and said netlist is provided with all of information as to an element name, a device sort, an operating model, shape information, and peripheral shape information with respect to each of device elements of said semiconductor integrated circuit; and furthermore, connection information between the wiring line parasitic elements and the device elements.

* * * * *